United States Patent
Tao et al.

(10) Patent No.: US 12,295,206 B2
(45) Date of Patent: May 6, 2025

(54) METAL PLATE DESIGN FOR ELECTRONIC DISPLAY PANELS

(71) Applicant: Google LLC, Mountain View, CA (US)

(72) Inventors: Yi Tao, San Jose, CA (US); Qi Qi, San Jose, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/678,712

(22) Filed: May 30, 2024

(65) Prior Publication Data

US 2024/0315074 A1    Sep. 19, 2024

Related U.S. Application Data

(62) Division of application No. 17/041,123, filed as application No. PCT/US2019/042282 on Jul. 17, 2019, now Pat. No. 12,029,071.

(51) Int. Cl.
| | |
|---|---|
| *H10K 59/10* | (2023.01) |
| *B32B 3/26* | (2006.01) |
| *B32B 3/30* | (2006.01) |
| *B32B 5/18* | (2006.01) |
| *B32B 7/12* | (2006.01) |

(Continued)

(52) U.S. Cl.
CPC .............. *H10K 59/10* (2023.02); *B32B 3/266* (2013.01); *B32B 3/30* (2013.01); *B32B 5/18* (2013.01); *B32B 7/12* (2013.01); *B32B 15/046* (2013.01); *B32B 15/08* (2013.01); *B32B 37/182* (2013.01); *B32B 38/105* (2013.01); *H10K 71/00* (2023.02); *H10K 77/10* (2023.02);

(Continued)

(58) Field of Classification Search
CPC ...................................................... H10K 59/10
See application file for complete search history.

(56) References Cited

U.S. PATENT DOCUMENTS

| 8,928,217 B2 | 1/2015 | Ji-Young et al. |
| 9,600,111 B2 | 3/2017 | Sang-min et al. |

(Continued)

FOREIGN PATENT DOCUMENTS

| CN | 101464571 | 6/2009 |
| CN | 102098882 | 6/2011 |

(Continued)

OTHER PUBLICATIONS

International Preliminary Report on Patentability in International Application No. PCT/US2019/042282, mailed on Jan. 27, 2022, 10 pages.

(Continued)

*Primary Examiner* — Robert J May
(74) *Attorney, Agent, or Firm* — Fish & Richardson P.C.

(57) ABSTRACT

A method of assembling a display panel includes laminating a back plate to a display layer to form an untrimmed display panel, the back plate including a metal layer that includes a trimming path defined by one or more line segments having reduced metal content compared to other portions of the metal layer. The method further includes trimming the untrimmed display panel along the one or more line segments to define one or more edges of the display panel. For one or more locations along each of the one or more edges defined by the line segments, the metal layer is flush with the corresponding edge of the display panel.

10 Claims, 5 Drawing Sheets

(51) Int. Cl.
  *B32B 15/04* (2006.01)
  *B32B 15/08* (2006.01)
  *B32B 37/18* (2006.01)
  *B32B 38/00* (2006.01)
  *H10K 71/00* (2023.01)
  *H10K 77/10* (2023.01)

(52) U.S. Cl.
  CPC . *B32B 2307/732* (2013.01); *B32B 2310/0843* (2013.01); *B32B 2311/00* (2013.01); *B32B 2457/206* (2013.01)

(56) References Cited

U.S. PATENT DOCUMENTS

| | | |
|---|---|---|
| 2010/0011928 A1 | 1/2010 | Lee et al. |
| 2013/0000715 A1 | 1/2013 | Moslehi et al. |
| 2014/0094079 A1 | 4/2014 | Ito et al. |
| 2017/0254518 A1* | 9/2017 | Vasylyev ............... F21V 9/08 |
| 2018/0217415 A1 | 8/2018 | Qingyong et al. |
| 2019/0148677 A1 | 5/2019 | Luo et al. |

FOREIGN PATENT DOCUMENTS

| | | |
|---|---|---|
| CN | 104521331 | 4/2015 |
| CN | 104765180 | 7/2015 |
| CN | 104916662 | 9/2015 |
| CN | 106653818 | 5/2017 |
| CN | 107167981 | 9/2017 |
| CN | 107706210 | 2/2018 |
| CN | 107931845 | 4/2018 |
| CN | 109616506 | 4/2019 |
| JP | 2014-071231 | 4/2014 |
| KR | 10-2010-0008607 | 1/2010 |
| TW | 2006-03670 | 1/2006 |
| WO | WO 2019095630 | 5/2019 |

OTHER PUBLICATIONS

International Search Report and Written Opinion in Appln. No. PCT/US2019/042282, mailed on Jun. 24, 2020, 18 pages.
Notice of Allowance in Korean Appln. No. 10-2022-7001308, mailed on Jan. 9, 2024, 3 pages (with English translation).
Office Action in Chinese Appln. No. 201980098042.4, mailed on Aug. 15, 2023, 14 pages (with English translation).
Office Action in European Appln. No. 19749506.2, mailed on Feb. 7, 2023, 5 pages.
Office Action in Korean Appln. No. 10-2022-7001308, mailed on Jul. 7, 2023, 8 pages (with English translation).
Office Action in Taiwan Appln. No. 109124169, mailed on Apr. 13, 2021, 8 pages (with English translation).

* cited by examiner

METAL PLATE DESIGN FOR ELECTRONIC DISPLAY PANELS

CROSS-REFERENCE TO RELATED APPLICATION

This patent application is a divisional (and claims the benefit of priority under 35 USC 120) of U.S. patent application Ser. No. 17/041,123, filed Sep. 24, 2020, now U.S. Pat. No. 12,029,071, issued on Jul. 2, 2024, which is a National Stage Application under 35 U.S.C. § 371 and claims the benefit of International Application No. PCT/US2019/042282, filed Jul. 17, 2019. The disclosure of the foregoing applications are hereby incorporated by reference in their entirety.

BACKGROUND

Many flat panel displays include a back plate laminated to a display layer in order to provide support and protection for the display layer. The back plate often includes a protective metal layer laminated to a polymer layer.

Manufacturing such an electronic display often involves trimming the display layer to a predetermined size. Because the back plate typically includes a hard material, such as a metal layer, the back plate can be difficult to trim. Accordingly, the back plate is typically pre-trimmed, often to a size that is slightly smaller than the predetermined size of the display. In this way, the display panel can be trimmed after the back plate is laminated to the display layer without the back plate having to be cut during the trimming process. However, an offset between one or more edges of the protective layer and the edge of the display panel may result, leaving the edges of the display layer exposed and susceptible to damage.

SUMMARY

Back plates that can be readily trimmed after lamination to a display are disclosed. Accordingly, display panels featuring little or no offset between the back plate and the display panel are provided. For example, in some embodiments, the back plate includes an array of through-holes that facilitate trimming. The centers of the holes align to the display panel edges. The back plate is laminated to the display layer first, then it is trimmed together with the display layer, resulting in a "mouse bite" pattern. The trimmed display panel with such design can provide improved protection to the display layer's edges. Generally, the through-holes can be circular or other shapes, such as rectangular holes, square holes, oval holes, etc.

In some implementations, the back plate can include a metal layer, also called a cushion layer, with a locally thinned area. The thinned area can be easier for trimming together with the display layer compared to a back plate with a metal layer having uniform thickness. After trimming, the edges of the metal layer will be flush with the panel on left, top, and right edges, providing much improved protection.

Implementations can also provide a display panel that is thinner than those provided using conventional back plates. For example, in certain display panels (e.g., certain OLED panels) there is often a polymer (e.g., PET) layer that supports the display layer and is laminated between it and the metal layer of the back plate. Because a metal layer attached to a display layer as disclosed can provide improved mechanical protection of the display layer, the polymer layer may be removed. Therefore, the display panel stack-up thickness can be reduced.

In general, in a first aspect, a method of assembling a display panel includes laminating a back plate to a display layer to form an untrimmed display panel, the back plate including a metal layer that includes a trimming path defined by one or more line segments having reduced metal content compared to other portions of the metal layer. The method further includes trimming the untrimmed display panel along the one or more line segments to define one or more edges of the display panel. For one or more locations along each of the one or more edges defined by the line segments, the metal layer is flush with the corresponding edge of the display panel.

Implementations of the method can include one or more of the following features. In some implementations, the trimming path includes a plurality of through-holes perforating the metal layer arranged along a line, each through-hole being separated from an adjacent through-hole by a strip of metal of the metal layer. The locations where the metal layer is flush with the one or more edges can correspond to the strips separating the adjacent through-holes. The metal layer can be recessed from the one or more edges at locations between the strips.

The shape of the through-holes can be circular, square, rectangular, or oval. The through-holes have a maximum dimension in a range from 0.1 mm to 1 mm.

In some implementations, the trimming path includes a channel having a reduced thickness compared to the other portions of the metal layer. In some implementations, the channel is provided by forming the metal layer or etching the metal layer. The metal layer can have the reduced thickness at the location where the metal layer is flush with the one or more edges of the display panel.

In yet other implementations, the line includes three segments and the laminated article is trimmed along each of the segments to define three edges of the display panel. The display panel can include a panel tail extending from a fourth edge of the display panel and the back plate can be recessed from the fourth edge.

The display panel is trimmed using a laser in some implementations. In other implementations, the display panel is trimmed by EDM. In yet other implementations, the display panel is trimmed by scribing.

The display panel can include an organic light emitting diode (OLED) layer. The display panel can further include a polymer film supporting the OLED layer.

In some implementations, the back plate further includes a foam layer and a pressure sensitive adhesive layer.

In another aspect, the invention features a display panel that includes a display layer including an organic light emitting diode (OLED) layer. The display panel also includes a back plate laminated to the display layer, the back plate including a metal layer having at least one edge that is flush with a corresponding edge of the display panel at one or more locations.

In some implementations, the metal layer includes spaced apart strips of metal at the one or more locations, the metal layer being recessed from the corresponding edge of the display panel between the spaced apart strips. The strips can be spaced apart by 1 mm or less.

In some implementations, the metal layer has a reduced thickness at the at least one edge compared to a thickness of the metal layer at other locations. In other implementations, the metal layer is flush with three edges of the display panel at one or more locations. The metal layer can be recessed from a fourth edge of the display panel. The display panel can further include a panel tail extending from the display panel at the fourth edge.

In some implementations, the back plate of the display panel can further include a foam layer between the metal layer and the display layer. In other implementations, the display layer of the display panel includes a polymer film between the back plate and the OLED layer.

Among other advantages, embodiments feature methods of assembling a display panel that is faster than methods of assembling a conventional display panel. That is, because a metal layer of a back plate attached to a display layer has reduced metal content along a trimming path, trimming the metal layer takes less time than trimming a metal layer of a conventional electronic display panel.

The trimming can be performed by a laser or an electrical discharge machine. Both machines generate heat that can damage the electronic display. The disclosed method can decrease the trimming time, therefore decreasing the chance of heat damage to the electronic display.

As another advantage, while conventional display panels include an offset between the metal layer of the back plate and the edge of the display layer, the disclosed display panels include a metal layer having a trimming path chosen such that the metal layer is substantially flush with the edges of the display layer. The metal layer being flush with the edges of the display layer provides increased protection compared to a metal layer that does not extend to the edges of the display layer.

Other advantages will be evident from the description, drawings, and claims.

BRIEF DESCRIPTION OF THE DRAWINGS

Like reference symbols in the various drawings indicate like elements.

DETAILED DESCRIPTION

Figure 1A:
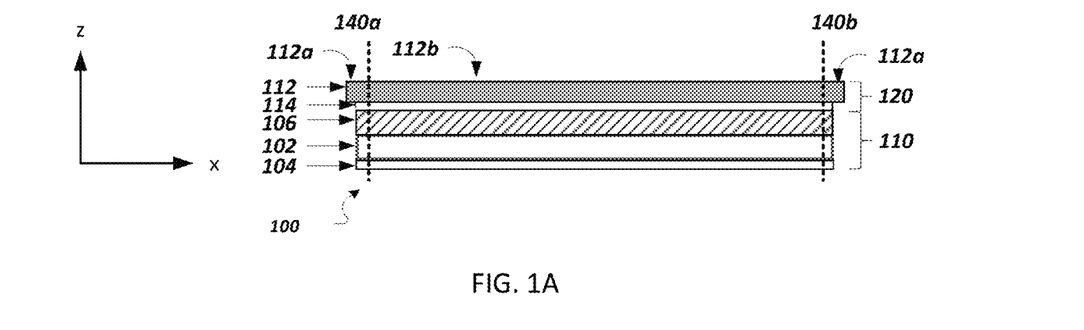
FIG. 1A is a cross-sectional view of a display panel that includes a metal layer prior to trimming.

Referring to FIG. 1A, a pre-trimmed display panel 100, shown in cross-section (i.e., in the xz-plane of the Cartesian coordinate system provided), includes a display layer 110 laminated to a back plate 120. Display layer 110 includes a pixelated light emissive layer 102, or simply emissive layer 102 (e.g., pixels composed of organic light emitting diodes (OLEDs) and associated drive circuitry) supported by a polymer layer 106 on one side, and covered by a glass layer 104 on the opposite side. Polymer layer 106 is a polymer film that supports and protects display panel 102 and provides electrical insulation for the panel. For example, polymer layer 106 can be polyethylene terephthalate.

Back plate 120 includes a metal layer 112 and a connecting layer 114 that bonds metal layer 112 to a surface of polymer layer 106. Metal layer 112 is typically formed from a metal (e.g., copper or aluminum) or an alloy (e.g., steel). Generally, metal layer 112 is sufficiently thick (i.e., in the z-direction) so that the layer provides sufficient mechanical strength to display panel 100, while not unnecessarily contributing to the weight, cost, and overall thickness of the display panel. In some embodiments, metal layer 112 has a thickness of about 0.2 mm or less (e.g., 0.15 mm or less, 0.12 mm or less, 0.1 mm or less, 0.08 mm or less, 0.05 mm or less), such as 0.01 mm or more.

Connecting layer 114 can be a pressure sensitive adhesive (PSA). Back plate 112 can include additional layers, such as a layer of foam.

Figure 1B:
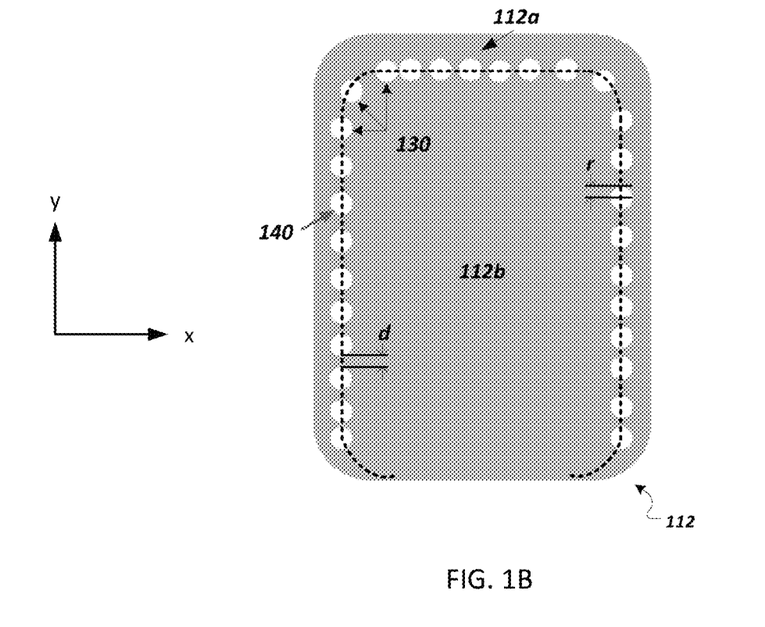
FIG. 1B is a plan view of a metal layer perforated by a set of holes aligned along a trimming path.

Referring also to FIG. 1B, metal layer 112 is perforated by a set of holes 130 aligned along a trimming path 140. Metal plate 112 is rectangular in shape in the xy-plane, having rounded corners. The trimming path 140 extends along three of the rectangle's edges corresponding to the top edge and side edges of the display panel.

Before being attached to polymer layer 106, metal layer 112 is perforated to form holes 130, each hole being separated from the adjacent holes by a strip of metal. Once polymer layer 106 and metal layer 112 are attached, a sacrificial portion 112a of the metal layer extends past the edge of display panel 102. The extension in the x-direction of sacrificial portion 112a is shown with respect to FIG. 1B, which includes the sacrificial portion and two dotted lines, 140a and 140b, corresponding to trimming path 140. The sacrificial portions of the metal layer 112 overlap with the edges of the untrimmed display layer, which are also removed upon trimming. The extension of sacrificial portion 112a, e.g., as measured along the x-direction or y-direction from trimming path 140 to the outside edge of the sacrificial portion, is typically about 0.5 mm to 5 mm.

Holes 130 are circular and the centers of holes 130 align with trimming path 140. Each hole has a radius r, as labeled in FIG. 1A. The extension of sacrificial portion 112a from the edge of display panel 102 determines, at least in part, radius r. That is, the minimum extension of sacrificial portion 112a, as measured along the x-direction or y-direction, from trimming path 140 to the outside edge of the sacrificial portion, should be larger than radius r. In some embodiments, the radius r is about 0.25 mm or less (e.g., 0.2 mm or less, 0.15 mm or less, 0.1 mm or less, 0.05 mm or less).

The distance between holes 130 is labeled d in FIG. 1A. The distance d is about 0.5 mm or less (e.g., 0.45 mm or less, 0.4 mm or less, 0.35 mm or less, 0.3 mm or less).

The number of holes 130 and the spacing between them can vary as desired. Generally, the larger the holes and/or smaller the spacing, d, between each hole, the easier it will be to trim the metal plate. However, the trade-off is that the larger the holes or the smaller the spacing, the less the metal plate will extend to the edge of the display panel once trimmed, providing less edge protection. Conversely, where the holes are relatively small and/or the spacing between the holes is relatively large, the harder the metal plate will be to trim but the more edge protection it will provide.

After back plate 120 is laminated to display layer 110, the back plate and display layer are trimmed along trimming path 140. For example, back plate 120 and display layer 110 can be trimmed using a metal scribe, a laser cutter, or an electric discharge machine.

Figure 2A:
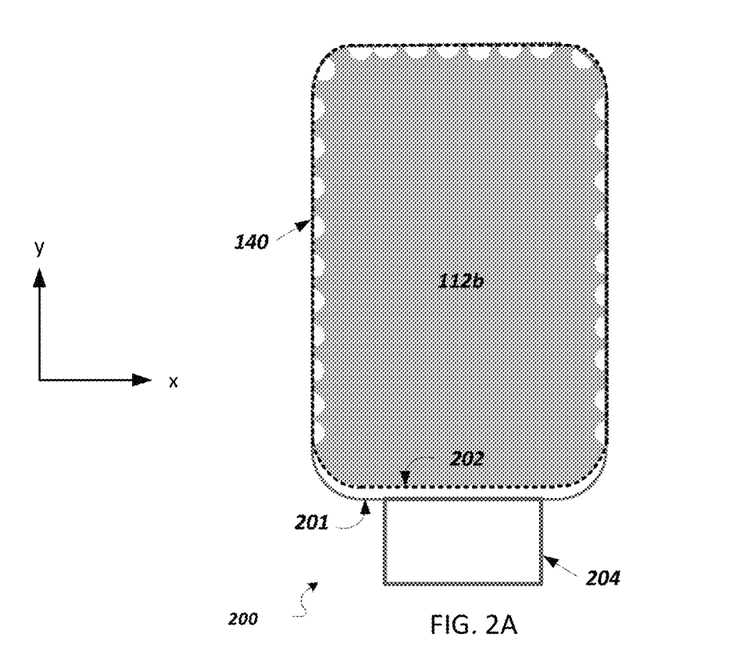
FIG. 2A is a plan view of a display panel that includes a portion of the metal layer of FIGS. 1A-1B.
Figure 2B:
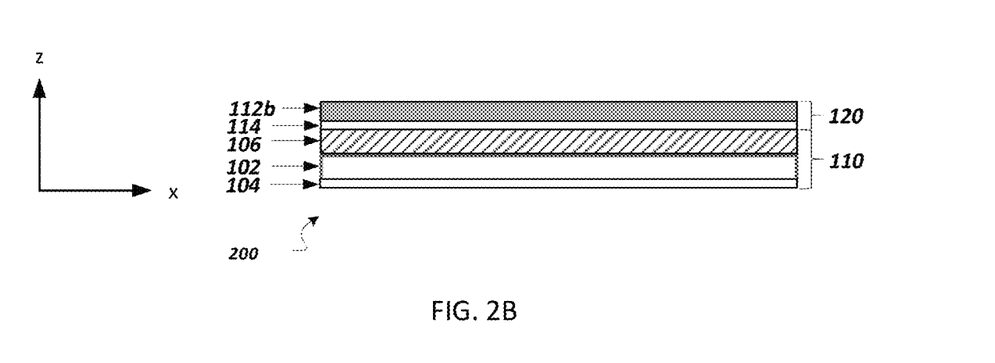
FIG. 2B is a cross-sectional view of the display panel of FIG. 2A.

Referring to FIGS. 2A and 2B, a plan view and a cross-sectional view, respectively, of a display panel 200 with back plate 120 after trimming. In particular, display panel 200 includes metal layer 112b, which is the portion of metal layer 112 that is left once sacrificial portion 112a is removed. Because of the alignment of holes 130, portions of metal layer 112b are recessed between the strips of metal that previously connected the holes.

Whereas metal layer 112 extends past the edge of display panel 102, metal layer 112b is flush with the edge of display layer 110 after trimming. That is, the strips of metal separating the spaces left behind by holes 130 after metal layer 112 is trimmed, are flush with the outside edge of display panel 200, leaving little to no offset between the edge of display layer 110 and the outside edge of metal layer 112b. For example, a first edge that is flush with a second edge may be within 0.05 mm of the second edge, e.g., within 0.02 mm, 0.01 mm, 0.005 mm or less.

Display panel 200 includes a panel tail 204 that is connected to display panel 200 at its bottom edge and extends in the y-direction away from the center of the display panel. Panel tail 204 is an electrical connection for connecting display panel 102 to drive electronics and other electrical components of display panel 200. Panel tail 204 is flexible, e.g., such that it can be folded under the display panel when the display panel is incorporated into an electronic device.

Because of panel tail 204, the bottom edge 202 of back plate 112 is not trimmed, but is recessed from the bottom edge 201 of display layer 110, where the panel tail 204 connects to the panel. For example, back plate 120 can be recessed from panel tail 204 by 0.05 mm or more (e.g., 0.08 mm or more, 0.1 mm or more, 0.12 mm or more, 0.15 mm or more, 0.2 mm or more).

Removing a portion of metal from metal layer 112 by perforating the metal layer along trimming path 140 is one way of facilitating the trimming of the metal layer while also providing protection for a display panel. Another method of assembling a display panel in which the back plate is trimmed with the display layer includes thinning metal from a portion of a metal layer along a trimming path.

Figure 3A:
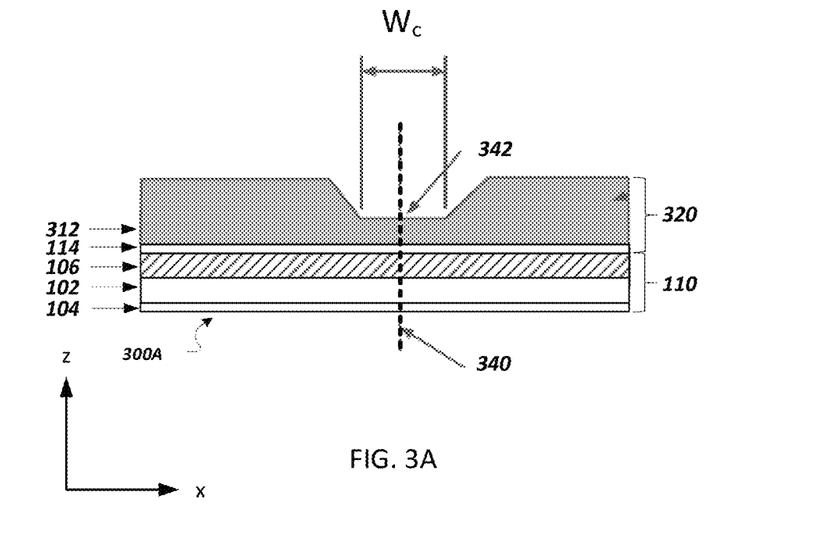
FIG. 3A is cross-sectional view of an example display panel that includes a metal layer showing a channel aligned along a trimming path.

Referring to FIG. 3A, a cross-sectional view of a portion of display panel 300A before trimming, the display panel including a back plate 320 that includes a metal layer 312 and connecting layer 114. Metal layer 312 has a channel 342 aligned along a trimming path 340. Display panel 300A also includes display layer 110 having polymer layer 106, which is connected to metal layer 312 by connecting layer 114.

Locally thinning metal layer 312 to form channel 342, results in less material to be removed during trimming. Therefore, channel 342 facilitates trimming along trimming path 340. Channel 342 can be provided by forming and/or etching metal layer 312. Channel 342 has a width $W_c$, which should be sufficiently large to allow for lamination and trimming tolerances. For example, $W_c$ can be approximately 0.5 mm or less (e.g., 0.4 mm or less, 0.3 mm or less, 0.2 mm or less, 0.1 mm or less). Generally, the thickness of metal layer 312 in channel 342 is sufficiently thick so that the metal layer is sufficiently robust to remain intact during the lamination process, while at the same time providing case of trimming after lamination. In some embodiments, the thickness of channel 342 is 50% or less (e.g., 40% or less, 30% or less, such as about 20% or more) of the thickness of the metal layer outside of the channel.

Figure 3B:
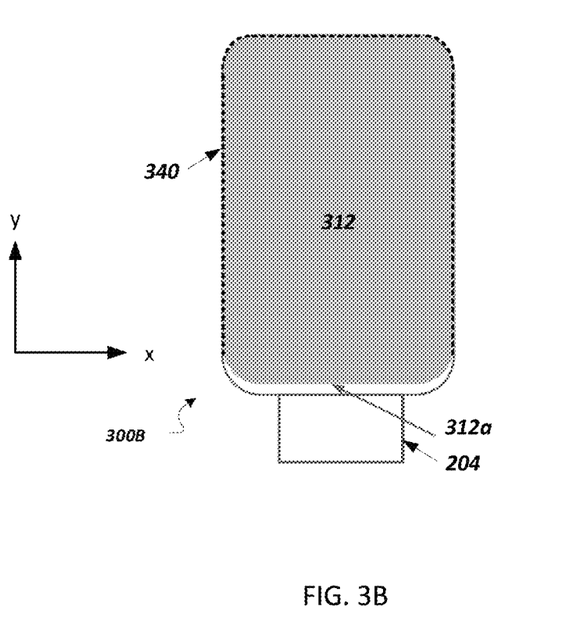
FIG. 3B is a plan view of a display panel, after the metal layer of FIG. 3A has been trimmed along the trimming path of FIG. 3A.

Trimming is performed after back plate 320 is laminated to display layer 110. FIG. 3B is a plan view of a display panel 300B, after the panel has been trimmed along trimming path 340. A portion of the edge of metal layer 312 that is thinned from channel 342 is flush with a portion of the edge of display layer 110 along trimming path 340. A bottom edge 312a of metal layer 312, does not extend to the edge of display layer 110. Bottom edge 312a is pre-trimmed before back plate 320 is attached to display layer 110 to avoid cutting panel tail 204.

Figure 4A:
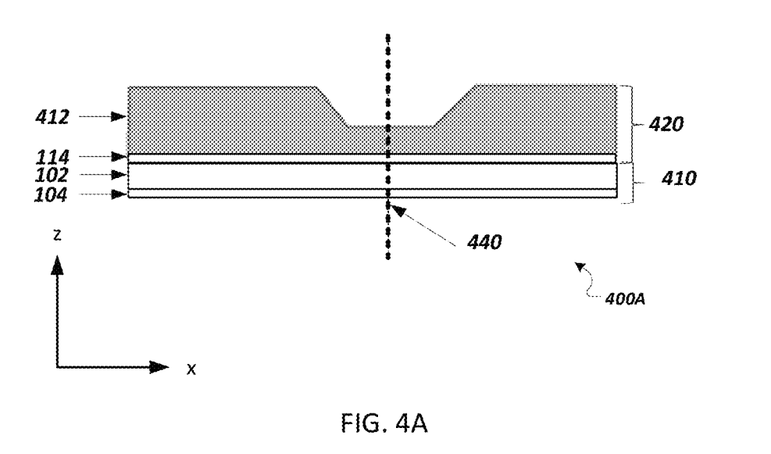
FIG. 4A is a cross-sectional view of a display panel without a polymer layer.
Figure 4B:
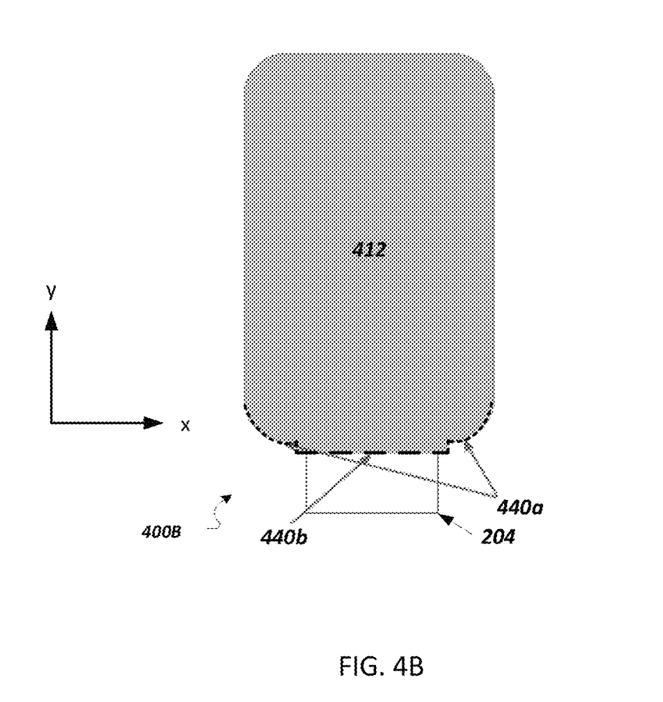
FIG. 4B is a plan view of a display panel without a polymer layer.

While the structure composing the display panels described above includes certain functional layers, in general, other embodiments are also possible. For example, display panels can generally include additional layers, such as a layer of foam between the metal layer of the back plate and the display layer. Alternatively, or additionally, certain layers can be eliminated. For example, in some embodiments, polymer layer 106 can be removed, allowing for a thinner display stack. FIGS. 4A and 4B are a cross-sectional view of a portion of a display panel 400A before trimming and plan view of a display panel 400B after trimming, respectively. Display panel 400A/B include a back plate 420 and a display layer 410. Back plate 420 includes a metal layer 412 and a connecting layer 114. Display layer 410 includes light emissive layer 102 and glass layer 104, and the back plate is connected directly to a back surface of light emissive layer 102.

FIG. 4A shows a trimming path 440, which shares the same path as trimming path 340, but also includes a path 440a and a path 440b. For simplicity, the portion of trimming path 440 that overlaps with trimming path 340 is omitted from FIG. 4B. While trimming paths 440a can be trimmed along with trimming path 340, trimming path 440b is pre-trimmed, before the trimming of paths 340 and 440a to avoid cutting panel tail 204.

Because the metal layer of back plate 420 is substantially flush after trimming, it is believed that the back plate can offer sufficient edge protection to light emissive layer 102 so that the additional polymer layer (e.g., layer 106 described above) is not necessary. Furthermore, eliminating the polymer layer can result in a thinner display panel compared to panels that include the polymer layer.

Referring to FIGS. 1B-3A, the maximum thickness of supported display panels 100, 200, and 300A, as measured in z-direction, can be about 0.15 mm to about 0.25 mm, depending on the thicknesses of the layers that make up the supported display panels. The maximum thicknesses of metal layers 112, 312, and 412 can all be approximately the same. For example, the maximum thicknesses can be about 0.12 mm or less (e.g., 0.1 mm or less, 0.075 mm or less, 0.05 mm or less, 0.02 mm or less).

Any type of electronic display can be used for display panel 102, e.g., LCD or OLED display.

The disclosed display panels can be part of a mobile device. For example, the mobile device can be a smartphone, laptop, tablet computer, or wearable device (e.g., smartwatch or head-mounted device, such as smart glasses). In some implementations, the supported display panels can be implemented in automotive displays or avionic displays (e.g., either in cockpit displays or in-flight entertainment systems).

Figure 5:
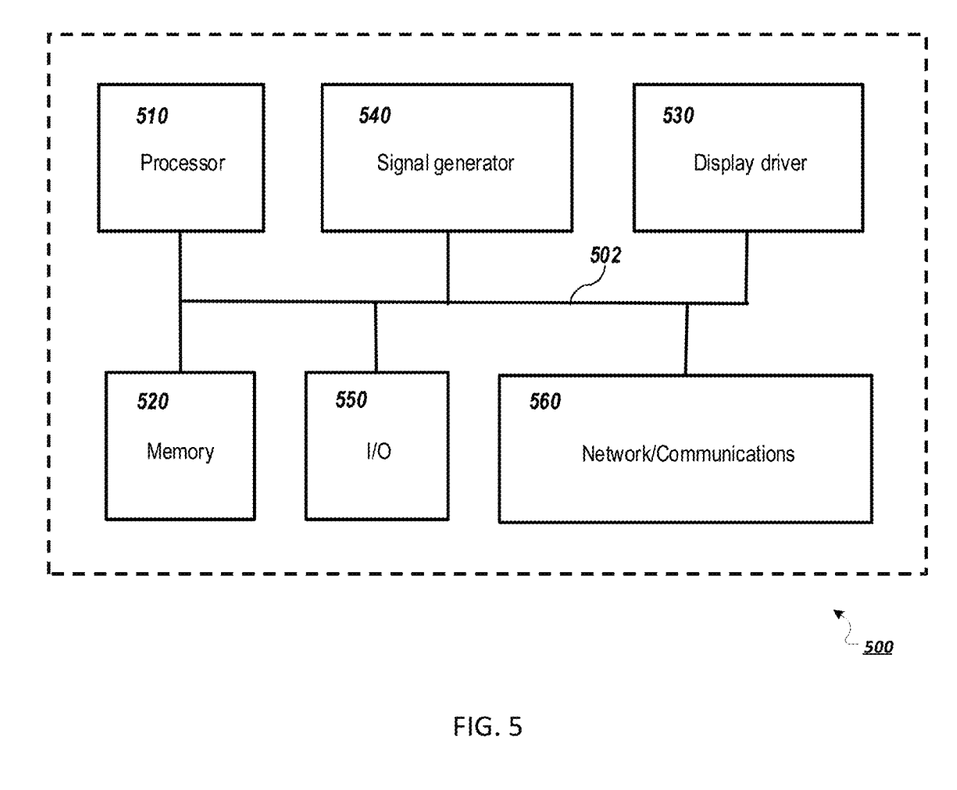
FIG. 5 is an example electronic control module of a mobile device.

The mobile device can include an electronic control module e.g., for controlling a supported display panel. Panel tail 204 can provide an electrical connection between the supported display panel and the electronic control module. In general, electronic control modules are composed of one or more electronic components that receive input from one or more sensors and/or signal receivers of the mobile device, process the input, and generate and deliver signal waveforms that cause the supported display panel to provide a suitable response. Referring to FIG. 5, an example electronic control module 500 of a mobile device includes a processor 510, memory 520, a display driver 530, a signal generator 540, an input/output (I/O) module 550, and a network/communications module 560. These components are in electrical communication with one another (e.g., via a signal bus 502).

Processor 510 may be implemented as any electronic device capable of processing, receiving, or transmitting data or instructions. For example, processor 510 can be a microprocessor, a central processing unit (CPU), an application-specific integrated circuit (ASIC), a digital signal processor (DSP), or combinations of such devices.

Memory 520 has various instructions, computer programs or other data stored thereon. The instructions or computer programs may be configured to perform one or more of the operations or functions described with respect to the mobile device. For example, the instructions may be configured to control or coordinate the operation of the device's display via display driver 530, signal generator 540, one or more components of I/O module 550, one or more communication channels accessible via network/communications module 560, one or more sensors (e.g., biometric sensors, temperature sensors, accelerometers, optical sensors, barometric sensors, moisture sensors and so on).

Signal generator 540 is configured to produce AC waveforms of varying amplitudes, frequency, and/or pulse profiles suitable to drive components such as an actuator that produces acoustic and/or haptic responses via the actuator. Although depicted as a separate component, in some embodiments, signal generator 540 can be part of processor 510. In some embodiments, signal generator 540 can include an amplifier, e.g., as an integral or separate component thereof.

Memory 520 can store electronic data that can be used by the mobile device. For example, memory 520 can store electrical data or content such as, for example, audio and video files, documents and applications, device settings and user preferences, timing and control signals or data for the various modules, data structures or databases, and so on. Memory 520 may also store instructions for recreating the various types of waveforms that may be used by signal generator 540 to generate signals for other components of the mobile device, such as an actuator. Memory 520 may be any type of memory such as, for example, random access memory, read-only memory, Flash memory, removable memory, or other types of storage elements, or combinations of such devices.

As briefly discussed above, electronic control module 500 may include various input and output components represented in FIG. 5 as I/O module 550. Although the components of I/O module 550 are represented as a single item in FIG. 5, the mobile device may include a number of different input components, including buttons, microphones, switches, and dials for accepting user input. In some embodiments, the components of I/O module 550 may include one or more touch sensor and/or force sensors. For example, the mobile device's display may include one or more touch sensors and/or one or more force sensors that enable a user to provide input to the mobile device.

Each of the components of I/O module 550 may include specialized circuitry for generating signals or data. In some cases, the components may produce or provide feedback for application-specific input that corresponds to a prompt or user interface object presented on the display.

As noted above, network/communications module 560 includes one or more communication channels. These communication channels can include one or more wireless interfaces that provide communications between processor 510 and an external device or other electronic device. In general, the communication channels may be configured to transmit and receive data and/or signals that may be interpreted by instructions executed on processor 510. In some cases, the external device is part of an external communication network that is configured to exchange data with other devices. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, Near Field Communication interfaces, infrared interfaces, USB interfaces, Wi-Fi interfaces, TCP/IP interfaces, network communications interfaces, or any conventional communication interfaces.

In some implementations, one or more of the communication channels of network/communications module 560 may include a wireless communication channel between the mobile device and another device, such as another mobile phone, tablet, computer, or the like. In some cases, output, audio output, haptic output or visual display elements may be transmitted directly to the other device for output. For example, an audible alert or visual warning may be transmitted from the mobile device to a second mobile device for output on that second device and vice versa. Similarly, the network/communications module 560 may be configured to receive input provided on another device to control the mobile device. For example, an audible alert, visual notification, or haptic alert (or instructions therefore) may be transmitted from the other device to the mobile device for presentation.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. For example, while the foregoing displays are depicted as direct view displays (e.g., televisions or computer monitors), other implementations are possible.

What is claimed is:
1. A display panel, comprising:
   a display layer comprising an organic light emitting diode (OLED) layer; and
   a back plate laminated to the display layer, the back plate comprising a metal layer having three edges that are flush with three corresponding edges of the display panel at one or more locations,
wherein the metal layer is recessed from a fourth edge of the display panel.

2. The display panel of claim 1, wherein the metal layer has a reduced thickness at the three edges compared to a thickness of the metal layer at other locations.

3. The display panel of claim 1, further comprising a panel tail extending from the display panel at the fourth edge.

4. The display panel of claim 1, wherein the back plate further comprises a foam layer between the metal layer and the display layer.

5. The display panel of claim 1, wherein the display layer comprises a polymer film between the back plate and the OLED layer.

6. A display panel, comprising:
a display layer comprising an organic light emitting diode (OLED) layer; and
a back plate laminated to the display layer, the back plate comprising a metal layer having at least one edge that is flush with a corresponding edge of the display panel at one or more locations, wherein the metal layer comprises spaced apart strips of metal at the one or more locations, the metal layer being recessed from the corresponding edge of the display panel between the spaced apart strips.

7. The display panel of claim 6, wherein the strips are spaced apart by 1 mm or less.

8. The display panel of claim 6, wherein the metal layer has a reduced thickness at the at least one edge compared to a thickness of the metal layer at other locations.

9. The display panel of claim 6, wherein the back plate further comprises a foam layer between the metal layer and the display layer.

10. The display panel of claim 6, wherein the display layer comprises a polymer film between the back plate and the OLED layer.

* * * * *